United States Patent [19]

Inoue et al.

[11] Patent Number: 5,723,236
[45] Date of Patent: Mar. 3, 1998

[54] PHOTOMASKS AND A MANUFACTURING METHOD THEREOF

[75] Inventors: Masashi Inoue, Sakai; Shinji Kobayashi, Nara, both of Japan

[73] Assignee: Sharp Kabushiki Kaisha, Osaka, Japan

[21] Appl. No.: 654,432

[22] Filed: May 28, 1996

[30] Foreign Application Priority Data

May 31, 1995 [JP] Japan ................................ 7-133830
May 9, 1996 [JP] Japan ................................ 8-115152

[51] Int. Cl.$^6$ ........................................... G03F 9/00
[52] U.S. Cl. ............................ 430/5; 430/22; 430/311
[58] Field of Search ............................ 430/5, 22, 311, 430/312; 356/401; 250/548

[56] References Cited

U.S. PATENT DOCUMENTS 5,429,896 7/1995 Hasegawa et al. ........................ 430/5

FOREIGN PATENT DOCUMENTS 6-175347 6/1994 Japan.
6-250376 9/1994 Japan.
6-282063 10/1994 Japan.
7-128840 5/1995 Japan.
7-140635 6/1995 Japan.
7-152145 6/1995 Japan.

OTHER PUBLICATIONS

Yamada et al, "Photomask and X–Ray Mask Technology II,"SPIE', vol. 2512, 20–21 Apr. 1995, Kawasaki City, Kanagawa, Japan, pp. 356–357.

Primary Examiner—S. Rosasco
Attorney, Agent, or Firm—Nixon & Vanderhye P.C.

[57] ABSTRACT

A half-tone film, a light-shielding film and resist are formed on a transparent substrate in this order, and the resist is removed by adjusting the dosage of exposure for each area so that film-thickness differences are provided. A predetermined pattern is formed on the half-tone film and the light-shielding film by utilizing the film-thickness differences. This half-tone pattern is a pattern to be copied onto resist on a wafer. Further, the light-shielding film is formed between the inside edge of a scribe line that separates chips from each other and the peripheral edge of the photomask. Thus, it becomes possible to prevent multiple exposure that tends to be generated upon conducting exposure using the step-and-repeat system, and also to maintain high light contrast by using a half-tone film.

13 Claims, 7 Drawing Sheets

PHOTOMASKS AND A MANUFACTURING METHOD THEREOF

FIELD OF THE INVENTION

The present invention relates to a photomask capable of eliminating multiple exposure that tends to be generated upon conducting exposure by using the step-and-repeat system, and also concerns a manufacturing method of such a photomask.

BACKGROUND OF THE INVENTION

Conventionally, reduced projection exposure has been known as an exposing method for manufacturing semiconductors and integrated circuits. In the reduced projection exposure, an enlarging mask (reticle) is used and patterns are reduced by a reduction lens, and printed onto the resist on a wafer. In the case when mask patterns are printed by using the reduced projection exposure, there is proposed a method wherein the resolution of resist pattern on a wafer and the depth of focus are improved by introducing phases into the light transmitted through the mask. In other words, it is proposed that a transparent film (hereinafter, referred to as the "shifter"), which inverts the phase of the transmitted light by 180°, is placed at least in one of light-transmitting sections (aperture sections) located on both sides of an opaque section (light-shielding section) on the photomask.

However, the problems with this arrangement are that the placement of the shifter is difficult when the element pattern is complicated, and that the number of manufacturing processes of the mask is increased twice as many as the number of those processes in conventional arrangements. In order to eliminate the use of the shifter, Japanese Laid-Open Patent Application No. 136854/1992 (Tokukaihei 4-136854) discloses a photomask (hereinafter, referred to as "half-tone film") wherein a semitransparent film (hereinafter, referred to as "half-tone mask")is used as a light-shielding section for forming a pattern. In this arrangement, the phase-shifting effect is obtained by inverting the phase of leak light that slightly passes through the half-tone film (generally, 6 to 10%) by 180° with respect to the light that passes through the aperture section.

At first, the half-tone mask used to have a two-layer film structure of chrome and $SiO_2$ (SOG and other materials). In this case, the transmittance was controlled by reducing the chrome film thickness, and the phase difference was controlled by adjusting the film thickness and the refractive index of $SiO_2$. Here, the film thickness of $SiO_2$ is indicated by:

$$d = \lambda/(2n-2),$$

wherein n represents the refractive index and λ represents the wavelength of exposure light.

However, since $SiO_2$, which is a non-metallic material, exhibits no thermal absorption to laser beams, the laser zapping, which has been used for repairing defects of conventional chrome patterns, can not be used for repairing defects of $SiO_2$ patterns; this remains an inherent problem of the phase-shifting method. As a result of research to find alternate materials for the shifter so as to solve the above-mentioned problem, Japanese Patent Laid-Open Publication No. 140635/1995 (Tokukaihei 7-140635) has proposed a method wherein an oxide-nitride film of MoSi or other materials is adopted. With this arrangement, the conventional laser zapping can be applied to the defect-repairing process. Moreover, since the oxide-nitride film of MoSi or other materials is controlled in its content rates of oxygen and nitrogen by changing reactive spattering conditions, it becomes possible to simultaneously satisfy the transmittance and the phase difference even with the use of monolayer film.

When mask patterns are printed onto a pattern-bearing substrate, for example, a wafer, by using reduced projection exposure, a reduced-projection aligner (hereinafter, referred to as "stepper") of the step-and-repeat system can be used. The photomask that is used in the stepper is provided with one or a plurality of circuit patterns of integrated-circuit chips formed thereon, and scribe lines are provided in a surrounding manner around the chip areas. For example, the scribe line is an area surrounded by the outside edge SO and the inside edge SI of scribe line, as is shown in FIG. 3(a) that is an explanatory drawing of the present invention.

As shown in FIG. 5(a) that indicates a commonly used exposing method using the step-and-repeat system, when a transparent substrate 17 (a photomask), which has a half-tone film whereon a predetermined pattern is formed, is placed with respect to blinds 18 for the stepper, in the resist 19 on a material 20 to be processed, that is, a wafer, an area (a hatched area in the drawing) that virtually corresponds to an edge-to-edge area of the blinds 18 is subjected to the exposing process.

Upon step-and-repeat process, a step pitch is normally given as a value obtained by adding the size (the distance between SI—SI) of the integrated circuit chips and the width of the scribe line (the distance between SI–SO). In other words, the step pitch coincides with the distance between the centers SC and SC of the scribe line. Therefore, when the next area is exposed, the wafer is shifted so that the center SC on the right side, shown in FIG. 5(a), coincides with the center SC on the left side, shown in FIG. 5(b).

Consequently, the first exposure area I' and the next exposure area II' overlap with each other to form a multiple exposure section III', and the scribe line is always subjected to double exposures. Further, the corner of the scribe line, which overlaps with other adjacent exposure areas, is subjected to quadruple exposures.

In the case of conventional chrome masks, since the scribe line is covered with a light-shielding film, the scribe line is shielded from light; however, in the half-tone mask, the light-shielding section is made of a half-tone film which has a slight transmittance. Therefore, although the resist 19 is only subjected to the dosage of exposure of several % compared with that of the light-shielding section upon one exposure, the resist 19 is subjected to an increased dosage of exposure after having been subjected to multiple exposures. This causes problems such as lack of resist and resist thickness loss at the multiple exposure section III'.

Moreover, in the plan view of the photomask in FIG. 3(a), the blind edge BE of a stepper is supposed to coincide with the outside edge SO of a scribe line. Here, in order to make room for positioning, it is normally located further outside than the outside edge SO with an interval W (approximately 2 mm). For this reason, as shown in FIG. 5(b), an area IV' on the resist 19, which corresponds to the interval area between the blind edge BE and the outside edge SO, is subjected to multiple exposures together with the device (resist) pattern inside the adjacent integrated circuit chip. In this case, dimensional variations are caused in the device pattern in response to the dosage of additional exposure light unless the transmittance of the interval area on the photomask is zero.

In order to solve these problems, for example, Japanese Laid-Open Patent Publication No. 175347/1994 (Tokukaihei 6-175347) discloses a method wherein a pattern is placed at an area to be light-shielded with a pitch not more than the limit of resolution of the reduced projection optical system so that the transmittance is reduced by utilizing the light-interference effect of reversed phases. For example, supposing that an i-line stepper is used, a pitch of approximately 2.0 µm (about ½ of which is an aperture section) is required and the aperture section needs to be machined with accuracy of ±0.2 µm, in order to obtain the required light-shielding effect. Here, if a resist-film thickness loss occurs at the dosage of exposure of approximately 20%, it is necessary to obtain the light-shielding effect that reduces the transmittance to approximately not more than 4%.

However, in the present level of technology, it is very difficult to detect defects of patterns used for the light-shielding purposes (for example, mask defects, partial defects in aperture size, etc.) with accuracy of 0.2 µm by using a photomask automatic defect-inspection system. Therefore, the problem of the above-mentioned conventional technique is that the light-shielding performance can not be ensured in the mask-forming stage.

In order to prevent multiple exposures, another countermeasure has been proposed wherein not only a half-tone film but also a light-shielding film is stacked on the peripheral area of the circuit-pattern formation area. However, patterns made of the half-tone film and patterns made of the light-shielding film are formed through different patterning processes; this results in poor positioning precision. Therefore, since it is difficult to conform the inside edge SI of scribe line to the edge of the light-shielding film, the multiple exposure section III', shown in FIG. 5(b), can not be eliminated with high precision.

Moreover, patterns, such as a vernier, a line-width measuring pattern and a test pattern, are formed on the scribe line; however, it is almost impossible to form all these patterns within the light-shielding-pattern formation area, and the light-shielding film has to be formed outside the patterns, that is, outside the proximity of the outside edge SO of the scribe line. In this case, since the scribe line is subjected to multiple exposures, dimensional variations in the various patterns on the scribe line occur.

In order to prevent such multiple exposures on the scribe line, it is proposed to widen the step pitch so as to eliminate the multiple exposure area. This arrangement, however, makes the chip size, which is defined by the step pitch, become bigger, and consequently decreases the number of chips that can be formed on a wafer.

In order to eliminate these disadvantages, it is proposed that a light-shielding film be provided on the scribe line and patterns on the scribe line, which are provided as patterns constituted of a light-shielding film and a half-tone film, be formed through a simultaneous patterning process. This arrangement, however, results in a state wherein the light-shielding film pattern and the half-tone film pattern mixedly exist within the photomask. Here, it is impossible to simultaneously print both of these patterns in an appropriate manner because of differences in exposure conditions, such as the difference between the optimal dosage of exposure for the half-tone film pattern and the optimal dosage of exposure for the light-shielding pattern. For example, in the case of a pattern having a width of 0.4 µm, supposing that the exposing time required for obtaining the optimal dosage of exposure for the half-tone film pattern is 300 msec and that the exposing time for obtaining that for the light-shielding film pattern is 800 msec, an exposing process for 300 msec would cause an underexposure for the light-shielding film pattern, thereby making the pattern unresolved, or making the width of the pattern become narrower even if it has been resolved.

Moreover, in the manufacturing processes of photomasks, with respect to the end point detection of resist that is carried out upon electron beam (EB) exposure onto resist for patterning the half-tone film, it has been proposed to use a method wherein a minute current that flows between the photomask surface and an opposing electrode through developing liquid is detected in a mono-sheet dipping stage. Here, portions on the photomask at which the metal film is exposed after dissolution of the resist serve as electrodes. In this method, in order to stably carry out the end point detection of development with high accuracy, it is required to reduce the sheet resistance of the photomask surface (electrode portions) so as to detect a minute current.

Generally, the half-tone film is an oxide-nitride film made of a material such as MoSi or Cr, and formed by the reactive sputtering method using $Ar+O_2$ gases or $Ar+O_2+N_2$ gases. Here, in order to simultaneously satisfy the transmittance (6 to 10%) and the refractive index (2.0 to 2.5) that are required for the half-tone film, certain oxygen and nitrogen contents are required; therefore, the sheet resistance increases drastically compared with that of the conventional chrome film. For example, MoSiON has that of several hundreds $\Omega$, where MoSi has that of several tens $\Omega$.

Thus, the increased sheet resistance of the half-tone film causes a problem in which no end point detection is available by using the above-mentioned method.

Moreover, a charge increase might occur upon EB exposure to resist for patterning the half-tone film.

SUMMARY OF THE INVENTION

The objective of the present invention is to provide a photomask which eliminates multiple exposure that tends to be generated upon conducting exposure using the step-and-repeat system where maintaining high light contrast that is an inherent feature of a half-tone mask and which improves the mass-productivity of half-tone masks to a great degree, and also to provide a manufacturing method of such a photomask.

In order to achieve the above-mentioned objective, the photomask of the present invention is characterized by having a transparent substrate through which exposure light transmits, a semitransparent film that has an inversion transmitting section for inverting the phase of the exposure light and a transmitting section that allows the exposure light to pass without changing the phase, and that forms a pattern on the transparent substrate by using the inversion transmitting section and the transmitting section, and a light-shielding film that has an edge coinciding with the inside edge of a scribe line and that is placed at a location on the semitransparent film including the scribe line and the outside area of the scribe line. Here, all the pattern is constituted of the semitransparent film.

In this arrangement, the light-shielding film is placed with high precision in relative locations at a location on the semitransparent film that corresponds to the area that is to be subjected to multiple exposures during exposure by a stepper exposing device or scanning exposure by using the step-and-repeat system within the projection-exposure-receiving surface; therefore, it becomes possible to prevent multiple exposure areas from being formed within the projection-exposure-receiving surface. Thus, this arrangement makes it possible to suppress defects such as film thickness losses due to multiple exposure areas to a minimum. Moreover, the pattern on the scribe line can be printed with high precision.

Furthermore, it becomes possible to use a conventional automatic defect-inspection system for photomasks in order to inspect the light-shielding area for possible pin-hole defects and other defects. For this reason, it is possible to ensure light-shielding properties in the mask-forming stage; thus, the lithography process using the photomask having the semitransparent film is improved in its mass-productivity to a great degree.

Furthermore, a manufacturing method of the photomask has a process for successively forming a semitransparent film, a light-shielding film and a resist film on a transparent substrate, a process for patterning the resist film so as to provide a pattern of the semitransparent film in a first area after forming the resist film so as to become thinner at the first area that at a second area, as well as for removing the light-shielding film and the semitransparent film by using the pattern of the resist film as a mask, and a process for removing only the resist film in the first area completely by utilizing the difference of thicknesses of the resist films in the first area and the second area, as well as for removing the light-shielding film by using the resist film in the second area as a mask.

With this method, the light-shielding film is placed at a predetermined position on the reticle with high accuracy. Consequently, it is possible to easily provide the photomask of the present invention.

Moreover, in the case when a light-shielding film having conductivity is used, it is possible to obtain required conductivity upon exposure onto the resist, since metal such as chrome exists on the semitransparent film. This makes it possible to positively prevent charge-up that occurs when EB exposure is applied onto the resist so as to pattern the semitransparent film.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 through 4, FIG. 6 and FIG. 7, the following description will discuss one embodiment of the present invention.

Figure 3A:
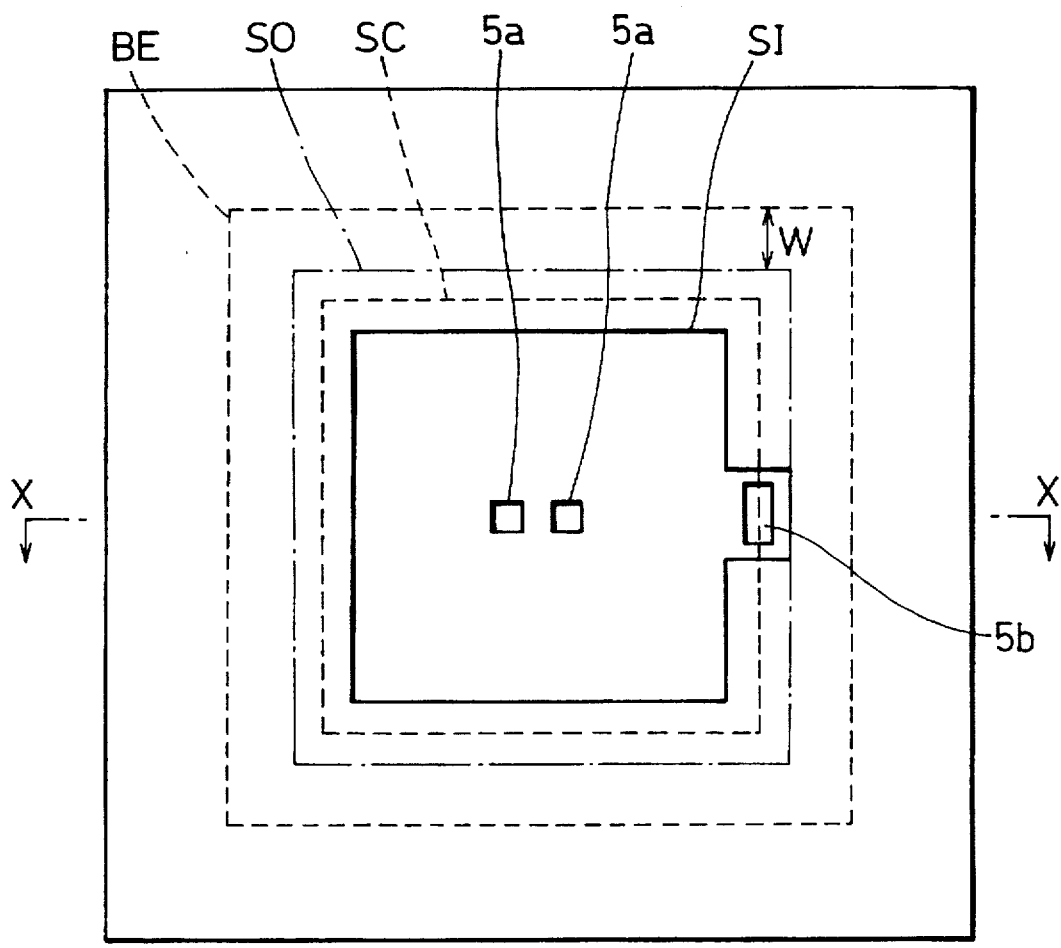
FIG. 3(a) is a plan view showing the photomask of the present embodiment.
Figure 3B:
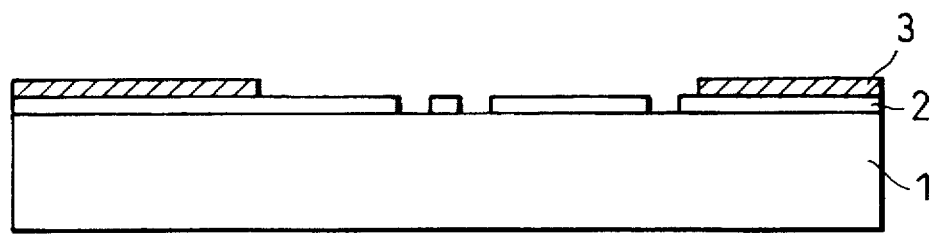
FIG. 3(b) is a X—X cross-sectional view of the photomask of FIG. 3(a).

As shown in FIG. 3(b), a photomask of the present embodiment has an arrangement wherein a half-tone film (semitransparent film) 2 and a light-shielding film 3 are stacked in this order on a transparent substrate 1 that transmits exposure light.

As illustrated in FIG. 3(a), in the photomask that is used for a stepper of the step-and-repeat system, a scribe line is defined in a surrounding manner around an integral-circuit-chip area. This scribe line corresponds to an area that is surrounded by an inside edge SI and an outside edge SO. In other words, a device pattern of one chip is formed in an area surrounded by the inside edge SI. In this case, inside-tip patterns are schematically indicated by 5a. Here, center SC indicates the center line of the scribe line. Further, blind edge BE is a portion that corresponds to an edge of a blind 8 (see FIG. 4) of the stepper, and the area inside the blind edge BE is irradiated by exposure light.

The half-tone film 2 is constituted of an inversion transmitting section for inverting the phase of the exposure light and a transmitting section (aperture section) at which the transparent substrate 1 is bared. Here, the inversion transmitting section and the transmitting section form the inside-chip patterns 5a and a pattern 5b within the scribe-line area, which are copied onto resist (a surface subjected to the projection exposure) on a wafer of the transparent substrate 1.

Upon exposure using the step-and-repeat system, the light-shielding film 3 shields light so that no multiple-exposure portions are generated on the resist on the wafer. In other words, as shown in FIG. 3, the light-shielding film 3 is placed at an area that is surrounded by the inside edge SI and the peripheral edge of the photomask.

Here, in periphery of the pattern 5b that is placed on the scribe line, the light-shielding film 3 is selectively removed. Additionally, it is necessary to provide a predetermined distance for the interval between the pattern edge of the half-tone film 2 and the edge of the light-shielding film 3 so as to obtain proper effects as the half-tone film 2, and the predetermined distance is approximately 5 μm on the photomask. Further, it is not necessary to make the edge of the light-shielding film 3 to be removed coincident with the outside edge SO or the inside edge SI of the scribe line. Moreover, there is no pattern formed at a position on one side of the scribe line that corresponds to another position on the opposing side of the scribe line at which the pattern 5b is formed. In other words, there is no pattern formed at a position that is subjected to multiple exposures. This arrangement makes it possible to resolve the pattern 5b on the scribe line.

Figure 4A:
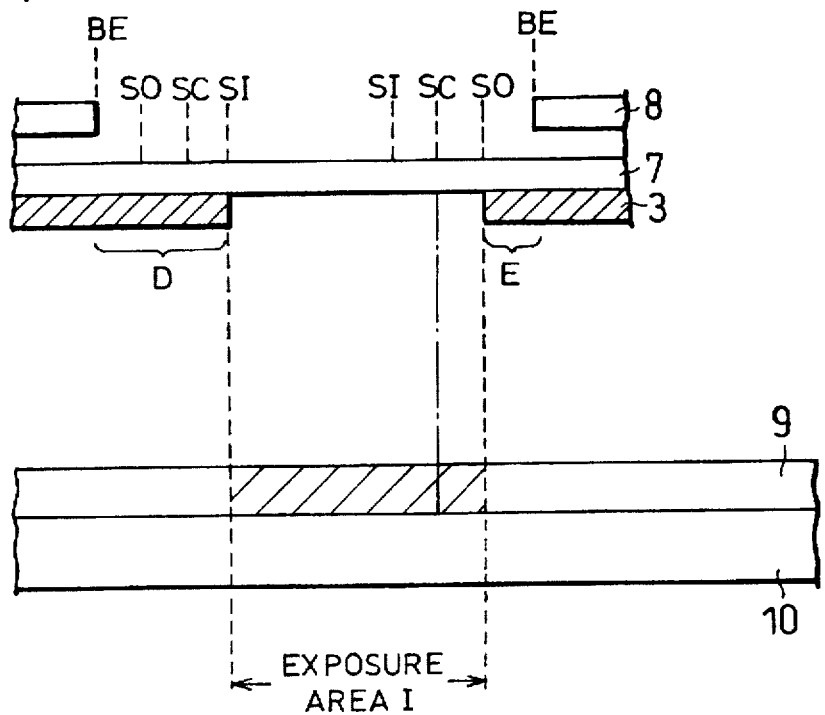
FIGS. 4(a) and 4(b) are explanatory drawings each of which shows exposure areas after exposure of the step-and-repeat system is conducted by using the photomask of the present embodiment.

A construction shown in FIG. 4(a) is obtained when an exposure process of the step-and-repeat system is conducted after having attached to a stepper the photomask which has the light-shielding film 3 and the transparent substrate 7 that is provided with the half-tone film 2 on which a predetermined pattern has been formed as shown in FIG. 3. In other words, the exposure light is shielded by the light-shielding film 3, and an exposure area I is exposed within the resist 9 that has been formed as a film on a member 10 to be etched.

Figure 4B:
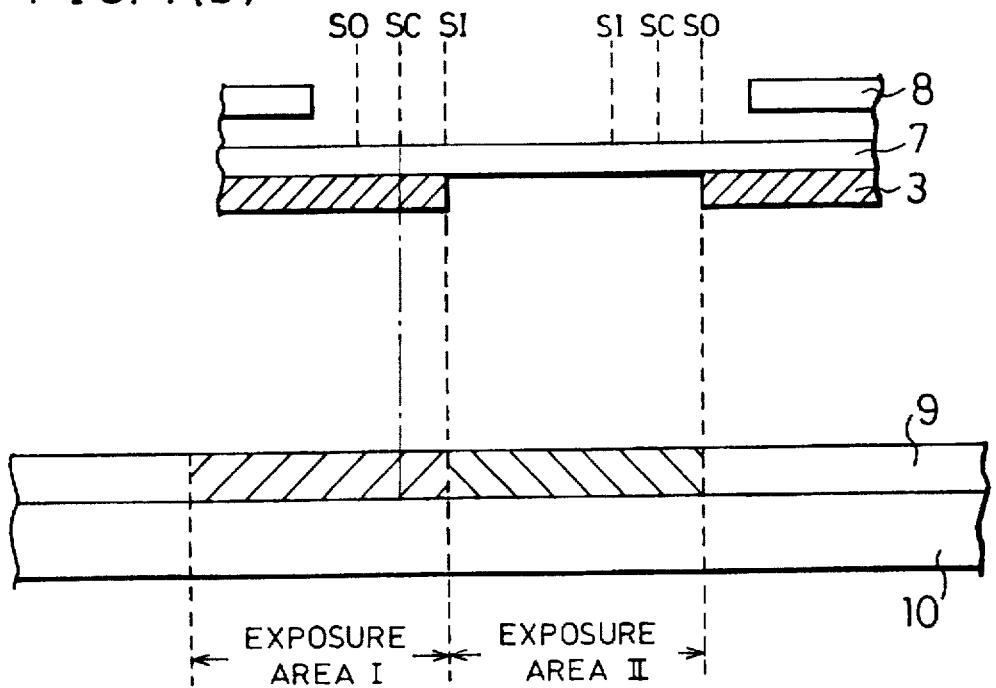
Figure 5A:
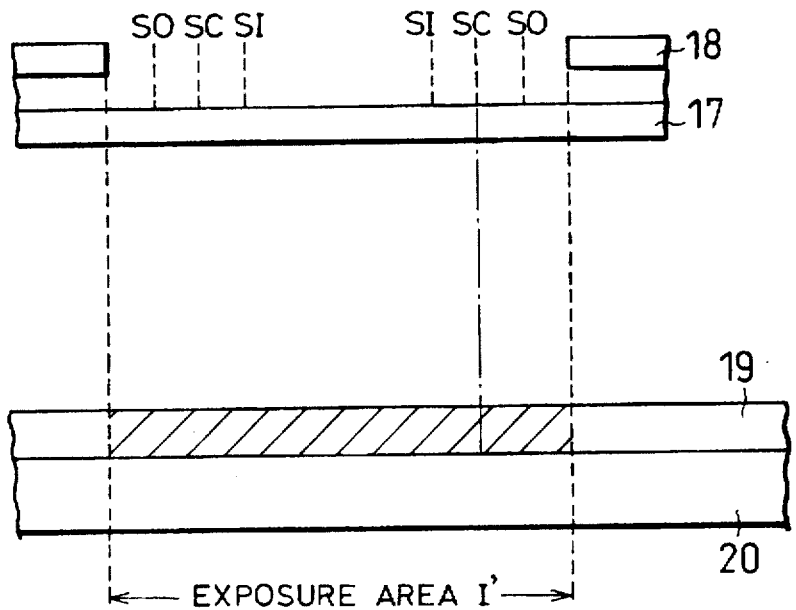
FIGS. 5(a) and 5(b) are explanatory drawings each of which shows exposure areas after exposure of the step-and-repeat system is conducted by using a conventional photomask.
Figure 5B:
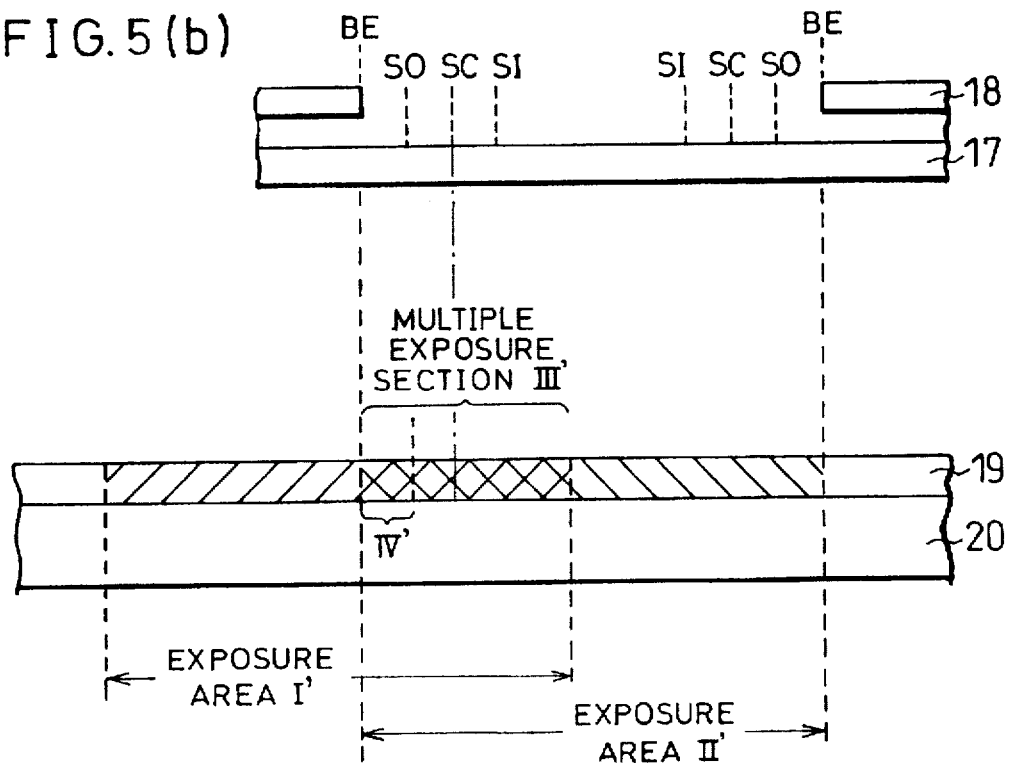

In the case when the wafer is shifted relatively on the left side in FIG. 4(a) in order to expose the next area, since the step pitch is equal to the distance between the centers SC of the scribe lines, the step is made so that the center SC on the right side shown in FIG. 4(a) coincides with the center SC on the left side shown in FIG. 4(b). At this time, since the edge (the outside edge SO) of the light-shielding film 3 on the right side, shown in FIG. 4(a), coincides with the edge (the inside edge SI) of the light-shielding film 3 on the left side, the next exposure is carried out within an exposure area II that has no overlapped portion with the exposure area I.

As described above, since no overlapped portion exists between the exposure area I and the exposure area II, no multiple exposure portion is generated. Therefore, it becomes possible to prevent problems such as resist loss and film thickness loss due to multiple exposure. Here, as long as the light-shielding film 3 is placed at least in an area D between the blind edge BE and the inside edge SI on the advancing-direction side of a wafer and an area E between the blind edge BE and the outside edge SO on the opposite side to the advancing-direction, the same effects as those described in FIG. 4 are obtained.

Moreover, in the case when the light-shielding film 3 is formed by a material having conductivity, it becomes possible to use a conventional automatic defect-inspection system for photomasks in order to inspect the light-shielding area for possible pin-hole defects and other defects. For this reason, it is possible to ensure light-shielding properties in the mask-forming stage; thus, the lithography process using the photomask having the half-tone film 2 is improved in its mass-productivity to a great degree.

Additionally, although the plan view of FIG. 3(a) shows a case where only one chip is formed on the photomask, the light-shielding films may of course be applied to another case where circuit patterns of a plurality of chips exist on one photomask. In this case, the light-shielding film is preferably provided on an outside scribe line that is formed when the plurality of chips are taken as one area.

Figure 6A:
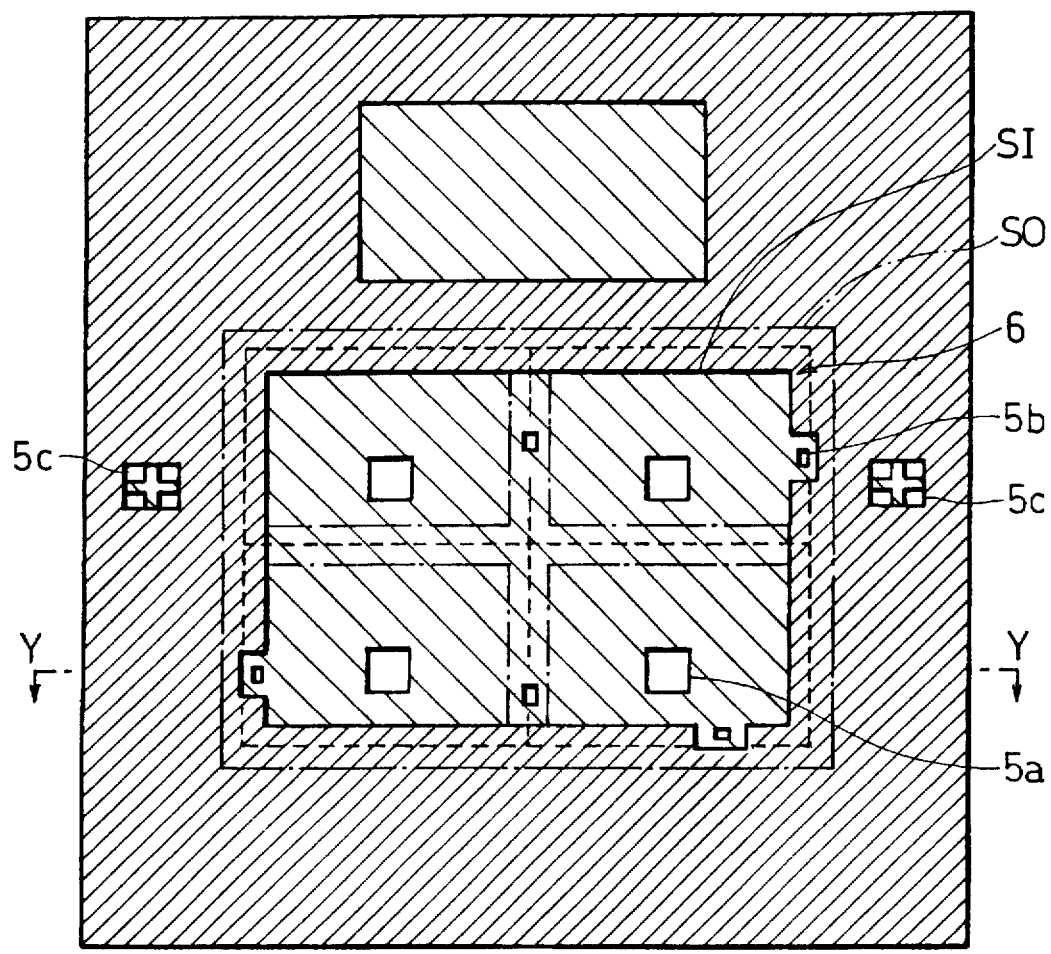
FIG. 6(a) is a plan view showing a photomask wherein patterns corresponding to four chips are formed on one photomask.
Figure 6B:
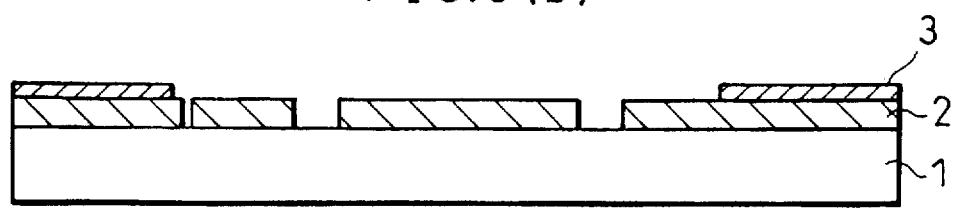
FIG. 6(b) is a Y—Y cross-sectional view of the photomask of FIG. 6(a).

FIG. 6 shows one photomask on which patterns corresponding to four chips are formed. The four chips are respectively divided by scribe lines formed among the four chips, and another scribe line is provided in the periphery of a chip section 6 that is formed when the four chips are taken as one area. An inside-chip pattern 5a, such as contact holes, is formed in each chip.

A light-shielding film 3 is formed in an area outside of the peripheral edge (inside edge SI) of the chip section 6. In this case, reference numeral 5b indicates patterns to be formed on the scribe line, and reference numeral 5c indicates alignment marks which are used for a positioning process of the photomask with respect to the wafer. The light-shielding film 3, which is the same as that shown in FIG. 3, is not formed within at least the peripheral area including the patterns 5b.

Figure 7:
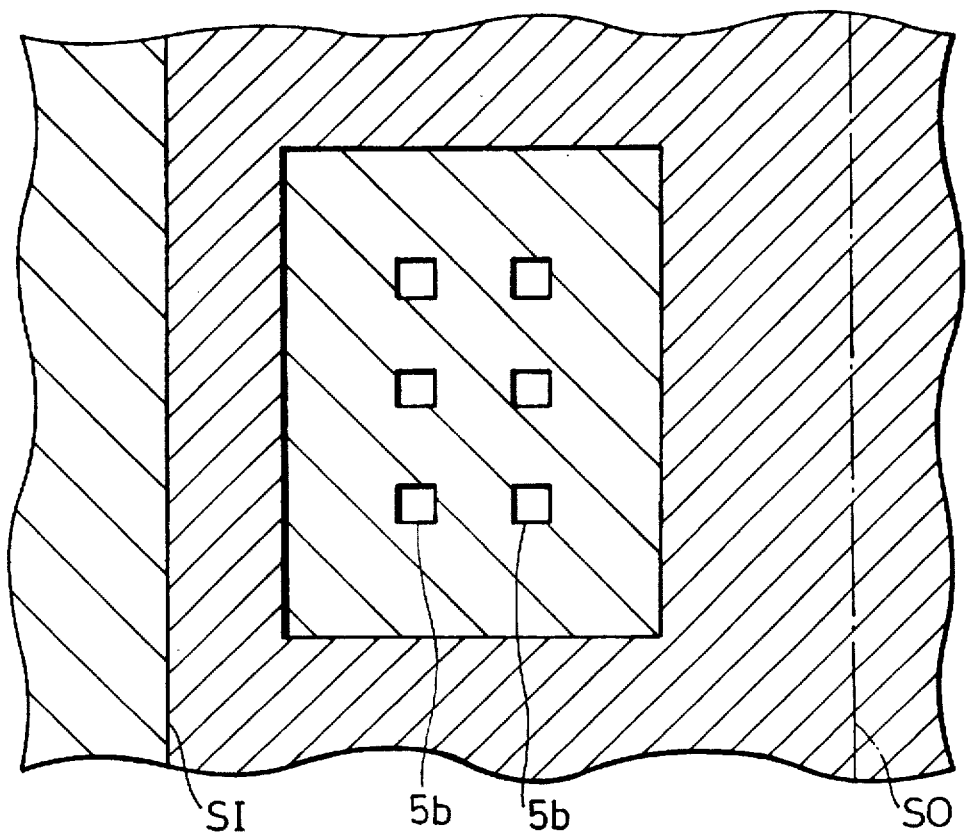
FIG. 7 is an enlarged view of a pattern that is formed on a scribe line.

The patterns 5b, which are to be placed on the scribe line, are commonly placed on approximately five locations. It is preferable to place them at positions far away from the exposure area. FIG. 7 is an enlarged view of the peripheral area of the pattern 5b shown in FIG 6. The pattern 5b is constituted of only the half-tone film 2 and the light-shielding film 3 is placed at a position with a predetermined distance away from the edge of the pattern 5b.

Next, referring to FIGS. 1(a) through 1(e), the following description will discuss manufacturing processes of the photomask.

Figure 1A:
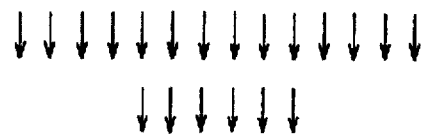
FIG. 1(a) is a cross-sectional view showing the first manufacturing process of a photomask in accordance with one embodiment of the present invention.

As shown in FIG. 1(a), a half-tone film 2 is formed on a transparent substrate 1 such as a quartz substrate. On this film, a light-shielding film 3 is formed by using a material such as chrome (Cr) that has light-shielding and conductive (several tens $\Omega$) properties through the spattering method or other methods. Successively, resist 4 is applied thereto with a thickness of virtually 5000 Å.

Here, in addition to oxide-nitride films such as Molybdenum silicide oxide-nitride (MoSiON) and Chromium oxide-nitride (CrON) films, any film can be used as the half-tone film 2 as long as it has a predetermined transmittance. Further, the film thickness of the half-tone film 2 is preferably set so as to provide an appropriate phase-shifting effect. For example, for MoSiON, a film thickness of 165 nm is required by the use of i-line stepper. Moreover, the required transmittance is 6 to 8%, for example, in the case of i-line.

With respect to the light-shielding film 3, thin films whose optical density is approximately 3.0 (not less than 2.9) can be used. In the case of chrome, since its optical density is approximately 3.0 at 100 nm, the thickness of Cr film needs to be set to approximately 100 nm. However, when a CrON film is used as the half-tone film 2, a Cr film can not be used as the light-shielding film 3 because sufficient selection ratio cannot be obtained during the etching process. Accordingly, it is necessary to appropriately select the combination of the half-tone film 2 and the light-shielding film 3. In the case when chrome can not be used as the light-shielding film 3, MoSi and Mo can be adopted. In this case, the thickness may be set to be as thick as that of Cr film; however, since their optical density is slightly lower than that of chrome, it is preferable to make the thickness slightly thicker correspondingly. Additionally, MoSi, which has a high light-shielding property, is formed into a semitransparent film by adding O and N so as to increase its light-transmitting property before it is used.

Figure 1B:
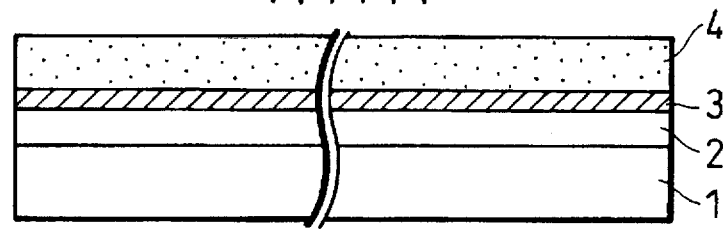
FIG. 1(b) is a cross-sectional view showing the second manufacturing process of the photomask.

Moreover, the exposure area (portions without a blind 8 (see FIG. 4) for the stepper) of the photomask is constituted of a complete-light-shield area A (second area), a pattern-forming area B (first area) and a light-transmitting area C, which are shown in FIG. 1(b). The complete-light-shield area A is an area wherein the light-shielding film 3 (/the half-tone film 2/the transparent substrate 1) is left after the patterning process; the pattern-forming area B is an area wherein a desired pattern is formed only by the half-tone film 2; and the light-transmitting area C is an area from which the light-shielding film 3 and the half-tone film 2 are removed.

In the exposure process, the dosage of exposure is adjusted so that the pattern-forming area B has remaining resist 4 whose film-thickness is approximately one-half of that on the complete-light-shield area A after the development through exposure, and so that the complete-light-shield area A remains as an unexposed portion (see FIG. 1(a)). The dosage of exposure onto the pattern-forming area B is normally set to approximately one-third of the dosage of exposure required for completely removing the resist 4. In general, since EB (Electron Beam) resist has a smaller τ-value (the rate of change in a remaining resist film in relation to the dosage of exposure) compared with photoresist, this controlling technology is sufficiently available. Further, upon exposure onto the pattern-forming area B, the light-transmitting area C is continuously exposed under the same conditions, and an additional dosage of exposure is further applied so as to make up for insufficiency for the resist patterning process. For example, the first exposure is applied with a dosage of exposure of 1.0 µC/cm², and the additional exposure is applied with a dosage of exposure of 1.8 µC/cm².

After the exposing and developing processes as described above, the resist 4 has a cross-sectional shape shown in FIG. 1(b). Here, the thickest portion of the resist 4 is approximately 4200 Å thick, and the thinnest portion thereof is approximately 2100 Å thick. Next, the light-shielding film 3 is subjected to a wet-etching process. In the case when chrome is used as the light-shielding film 3 and Cerium (II) diammonium nitrate is used as an etchant, sufficient selectivity is obtained with respect to the bed (the half-tone film 2), and no degradation occurs in the bed. Degradation in the bed, that is, a film thickness loss of the half-tone film 2, should be avoided since it is difficult to obtain uniformity in etching during the next etching process on the half-tone film 2, and since the transparent substrate 1 tends to be damaged.

Figure 1C:
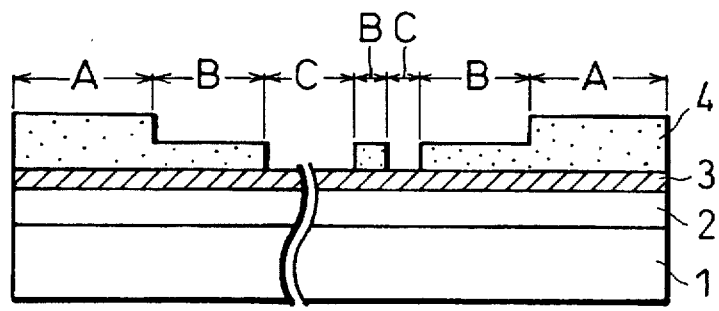
FIG. 1(c) is a cross-sectional view showing the third manufacturing process of the photomask.
Figure 1D:
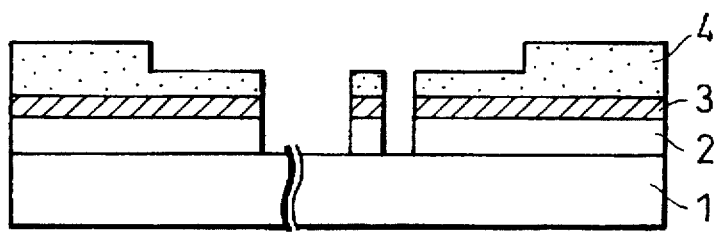
FIG. 1(d) is a cross-sectional view showing the fourth manufacturing process of the photomask.
Figure 1E:
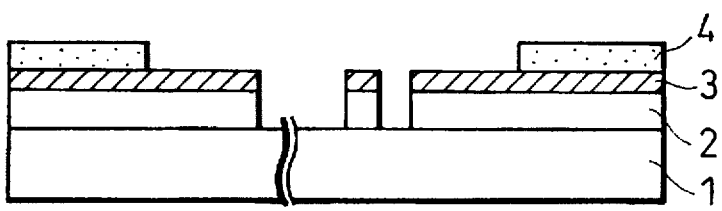
FIG. 1(e) is a cross-sectional view showing the fifth manufacturing process of the photomask.

Successively, the half-tone film 2 is subjected to a dry-etching process (see FIG. 1(c)). In this case, the light-shielding film 3, which forms the lower layer, serves as a mask in the same manner as the resist 4. Therefore, when $CF_4$ and $O_2$ are used as dry-etching gases, the selectivity on the half-tone film 2 and masking materials is improved to a great degree, compared with the case where only the resist 4 is used as the mask.

Thereafter, an $O_2$ plasma-ashing process is applied to the entire surface so that resist is completely removed only from the area (the pattern-forming area B) covered with the thin resist 4. Consequently, the film thickness of the complete-light-shield area A is set to one-half of the thickness at the first stage (see FIG. 1(d)). Then, the light-shielding film 3 is again subjected to a wet-etching process (see FIG. 1(e)).

Here, a high selectivity is required in the etching process on the light-shielding film 3, since a sufficient phase-shifting effect is not available upon removing the light-shielding film 3, if film reduction occurs in the half-tone film 2 that forms the bed. For this reason, the wet-etching process is used.

When removal of chrome is carried out by using an anisotropic-etching process, a difference in etching rate occurs between the central portion and the peripheral portion of the removal area due to the pattern dependence. In other words, a difference exists between the central portion and the peripheral portion in the thickness of the light-shielding film 3 that is to be removed by the etching process per unit time; therefore, a film thickness loss occurs in the half-tone film 2 when an over-etching process is carried out. For this reason, it is preferable to remove the light-shielding film 3 by using the wet-etching process.

Finally, after the resist 4 has been completely removed, a photomask is formed, wherein a pattern is provided by the half-tone film 2 that inverts the phase of exposure light at the pattern-forming area B and the light-transmitting area C, and wherein the complete-light-shield area A is covered with stacked films of the half-tone film 2 and the light-shielding film 3.

The above-mentioned processes makes it possible to desirably place complete light-shielding areas on a half-tone film that are required for manufacturing devices, by adjusting the dosage of exposure. In other words, the light-shielding film 3, which is used to prevent multiple exposure that is generated upon exposure using the step-and-repeat system, is provided at desired positions on a reticle with high positional accuracy; therefore, it becomes possible to produce photomasks such as shown in FIG. 3 and FIG. 6 in a stable manner. The photomasks having the optimized light-shielding film 3 prevents multiple exposure as described above, and also ensures inherent functions of half-tone patterns that are required to enhance the depth of focus of resist patterns on a wafer.

Figure 2A:
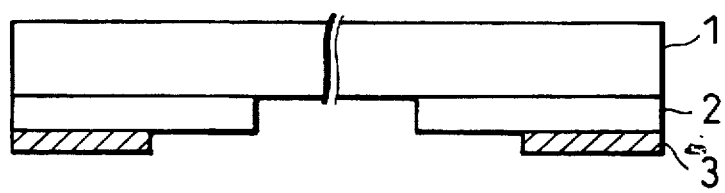
FIG. 2(a) is a cross-sectional view showing the photomask of the present embodiment.
Figure 2B:
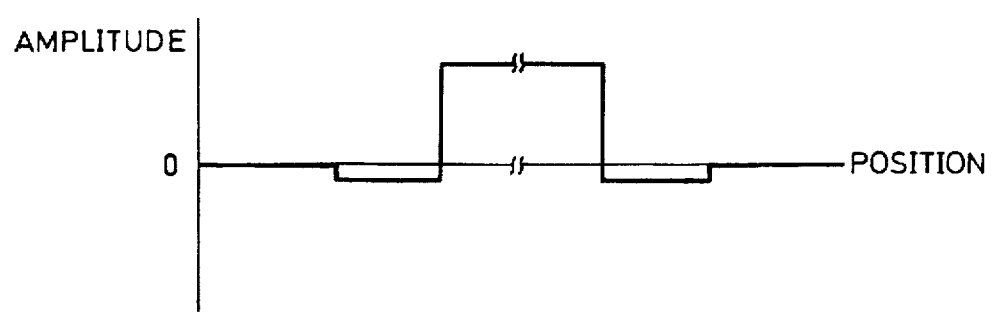
FIG. 2(b) is a distribution diagram that shows the amplitude distribution of light that has passed through the photomask of FIG. 2(a).

FIG. 2(b) shows the relationship between the position on the photomask of FIG. 2(a) and the amplitude of transmitted light. This indicates that the exposure light is completely shielded by the light-shielding film 3, and that the light intensity is rendered to zero at the border between the patterns by the half-tone film 2.

Moreover, in the case when a film having conductivity is used as the light-shielding film 3 during the manufacturing process of the photomask, it is possible to obtain required conductivity upon exposure onto the resist 4, since metal such as chrome exists on the half-tone film 2. This makes it possible to positively prevent charge-up that occurs when EB exposure is applied onto the resist 4 so as to pattern the half-tone film 2.

Furthermore, since sheet resistance is small on the surface of the photomask, it is possible to stably maintain the terminal detection of development of the resist 4 with high accuracy during the mono-sheet dipping development of EB resist. Consequently, it becomes possible to improve the dimension accuracy of the half-tone mask.

Additionally, in the manufacturing processes of the present invention, it may be proposed that patterns of the light-shielding film 3 and patterns of the half-tone film 2 are provided by using individual resist patterns. However, this case needs to have two resist-pattern-forming processes, thereby causing not only an increase in the number of the processes, but also difficulty in positioning upon forming the two resist patterns since it is difficult to take alignment signals due to the thinness of the chrome film. In other words, alignment marks have to be provided upon forming the first resist pattern, and after having carried out a positioning process based on these alignment marks, the second resist pattern has to be formed.

The positioning accuracy (±0.005 µm) of EB exposure of the present embodiment in the case of continuous double exposures is higher than the positioning accuracy by the use of the alignment marks. Therefore, it becomes possible to manufacture simple photomasks with high controllability by using the features of the EB exposure.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A photomask comprising:

a transparent substrate through which exposure light transmits;

a semitransparent film that has an inversion transmitting section for inverting the phase of the exposure light and a transmitting section that allows the exposure light to pass without changing the phase, the semitransparent film being arranged to form a pattern on the transparent substrate by using the inversion transmitting section and the transmitting section; and a light-shielding film that has an edge coinciding with an inside edge of a scribe line and that is placed at a location on the semitransparent film including the scribe line and the outside area of the scribe line, wherein all the pattern is constituted of the semitransparent film.

2. The photomask as defined in claim 1, wherein the light-shielding film is placed at an area located between the inside edge of the scribe line and a peripheral edge of the photomask.

3. The photomask as defined in claim 1, wherein the light-shielding film is formed so as to have an optical density of not less than 2.9.

4. The photomask as defined in claim 1, wherein the light-shielding film is made of a material selected from a group consisting of Cr, MoSi and Mo.

5. The photomask as defined in claim 1, wherein the light-shielding film is made of a material that is either of MoSi and Mo and the semitransparent film is made of CrON.

6. The photomask as defined in claim 1, wherein the light-shielding film is made of Cr and the semitransparent film is made of MoSiON.

7. A manufacturing method, which is used for a photomask comprising: a transparent substrate through which exposure light transmits; a semitransparent film that has an inversion transmitting section for inverting the phase of the exposure light and a transmitting section that allows the exposure light to pass without changing the phase, the semitransparent film being arranged to form a pattern on the transparent substrate by using the inversion transmitting section and the transmitting section; and a light-shielding film that has an edge coinciding with an inside edge of a scribe line and that is placed at a location on the semitransparent film including the scribe line and the outside area of the scribe line, all said pattern being constituted of the semitransparent film, comprising the steps of:

successively forming a semitransparent film, a light-shielding film and a resist film on a transparent substrate;

patterning the resist film so as to provide a pattern of the semitransparent film in a first area after forming the resist film so as to become thinner at the first area than at a second area, as well as removing the light-shielding film and the semitransparent film by using the pattern of the resist film as a mask, and removing only the resist film in the first area completely by utilizing the difference of thicknesses of the resist films in the first area and the second area as well as for removing the light-shielding film by using the resist film in the second area as a mask.

8. The manufacturing method for the photomask as defined in claim 7, wherein the film-thickness difference of the resist film between the first area and the second area is created by setting a dosage of exposure onto the first area to be greater than a dosage of exposure onto the second area.

9. The manufacturing method for the photomask as defined in claim 8, wherein the dosage of exposure is set to zero with respect to the second area, and is also set with respect to the first area so that the remaining film-thickness of the resist film in the first area is virtually one-half of that of the resist film in the second area.

10. The manufacturing method for the photomask as defined in claim 8, wherein the pattern of the resist film in the first area is formed by applying an additional exposure onto only a desired position within the first area under the same conditions as the exposure onto the first area, after having stopped the exposure onto the entire portion of the first area.

11. The manufacturing method for the photomask as defined in claim 7, wherein the light-shielding film is made of a material having conductivity.

12. A semiconductor device comprising:

a semiconductor substrate; and a pattern that is formed on the semiconductor substrate by using a photomask, the photomask being provided with: a transparent substrate through which exposure light transmits; a semitransparent film that has an inversion transmitting section for inverting the phase of the exposure light and a transmitting section that allows the exposure light to pass without changing the phase, the semitransparent film being arranged to form a pattern on the transparent substrate by using the inversion transmitting section and the transmitting section; and a light-shielding film that has an edge coinciding with an inside edge of a scribe line and that is placed at a location on the semitransparent film including the scribe line and the outside area of the scribe line, all said pattern being constituted of the semitransparent film.

13. An exposing method for a semiconductor device comprising the steps of:

applying an exposure onto a semiconductor substrate by using a step and repeat system through a photomask, the photomask being provided with: a transparent substrate through which exposure light transmits; a semitransparent film that has an inversion transmitting section for inverting the phase of the exposure light and a transmitting section that allows the exposure light to pass without changing the phase, the semitransparent film being arranged to form a pattern on the transparent substrate by using the inversion transmitting section and the transmitting section; and a light-shielding film that has an edge coinciding with an inside edge of a scribe line and that is placed at a location on the semitransparent film including the scribe line and the outside area of the scribe line, all said pattern being constituted of the semitransparent film, and forming a pattern onto the semiconductor substrate.

* * * * *